(12) United States Patent
Shin

(10) Patent No.: US 8,048,730 B2
(45) Date of Patent: Nov. 1, 2011

(54) SEMICONDUCTOR DEVICE AND METHOD FOR MANUFACTURING THE SAME

(75) Inventor: Eun Jong Shin, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 162 days.

(21) Appl. No.: 12/540,681

(22) Filed: Aug. 13, 2009

(65) Prior Publication Data

US 2010/0065916 A1 Mar. 18, 2010

(30) Foreign Application Priority Data

Sep. 18, 2008 (KR) .......................... 10-2008-0091502

(51) Int. Cl.
*H01L 21/338* (2006.01)

(52) U.S. Cl. ........ 438/184; 438/230; 438/265; 438/595; 257/336; 257/408; 257/E21.435

(58) Field of Classification Search ........................ None
See application file for complete search history.

(56) References Cited

U.S. PATENT DOCUMENTS 6,905,923 B1 * 6/2005 Paton et al. .................... 438/231
2007/0128786 A1 * 6/2007 Cheng et al. .................. 438/199

* cited by examiner

*Primary Examiner* — Evan Pert
*Assistant Examiner* — Scott R Wilson
(74) *Attorney, Agent, or Firm* — Saliwanchik, Lloyd & Eisenschenk

(57) ABSTRACT

Disclosed are a semiconductor device and a method for manufacturing the same. The semiconductor device includes an isolation area formed on a semiconductor substrate to define NMOS and PMOS areas, a gate insulating layer and a gate formed on each of the NMOS and PMOS areas, a primary gate spacer formed at sides of the gate, LDD areas formed in the semiconductor substrate at sides of the gate, a secondary gate spacer formed at sides of the primary gate spacer, source and drain areas formed in the semiconductor substrate at sides of the gate of the PMOS area; and source and drain areas formed in the semiconductor substrate at sides of the gate of the NMOS area, wherein the source and drain areas of the NMOS area are deeper than the source and drain areas of the PMOS area.

18 Claims, 4 Drawing Sheets

SEMICONDUCTOR DEVICE AND METHOD FOR MANUFACTURING THE SAME

CROSS-REFERENCE TO RELATED APPLICATION

This application claims the benefit under 35 U.S.C. §119 of Korean Patent Application No. 10-2008-0091502, filed on Sep. 18, 2008, which is incorporated herein by reference in its entirety.

FIELD OF THE INVENTION

The present disclosure relates to a semiconductor device and a method for manufacturing the same.

BACKGROUND

FIGS. 1 to 3 are views showing a method for manufacturing a symmetric semiconductor device.

Referring to FIG. 1, after forming an isolation area 11 on a semiconductor substrate 10 through a shallow trench isolation (STI) technology, an insulating layer 12 and a polysilicon layer 13 are stacked on the resultant structure. The semiconductor substrate 10 has areas for an N-type metal oxide semiconductor (NMOS) and a P-type MOS at one side and the other side thereof with respect to the isolation area 11.

As shown in FIG. 2, the insulating layer 12 and the polysilicon layer 13 are patterned to form gate insulating layers 12a and 12b and gate electrodes 13a and 13b respectively on the NMOS and PMOS area. Then, symmetric lightly doped drain (LDD) areas 14a and 14b are formed through respective ion implantation processes.

Thereafter, as shown in FIG. 3, after forming spacers 16a and 16b at sidewalls of the gate electrodes 13a and 13b, source and drain areas 15a and 15b are formed on the NMOS and PMOS areas through respective ion implantation processes.

However, problems in the structure of the symmetric semiconductor device are as follows.

First, a symmetric LDD structure having the same size at sides of each gate degrades a sub-threshold characteristic, reducing a driving current in a saturation state.

Second, in an inversion mode in which a sub-threshold current occurs, the LDD area at a source area degrades a swing characteristic of the device, and parasitic capacitance in an overlap area between the gate and the LDD area becomes a factor, reducing the operating speed of the device.

For example, when a flip-flop circuit is formed using the symmetric semiconductor device, an edge part of a swing characteristic graph cannot be not perpendicularly formed due to the influence of the driving current and the capacitance, so the swing characteristic graph has a parabolic configuration, representing propagation delay time.

Since the propagation delay time is proportional to the capacitance and inversely-proportional to an amount of driving current in each MOS area, the symmetric semiconductor device has a limitation in reducing the propagation delay time.

Third, a junction depth of an active area is important to control a critical dimension and an effective channel length of the gate electrode. Accordingly, the junction depth can be adjusted through an ion implantation process of indium (In) and/or antimony (Sb), which is are heavy ions, and a laser spike anneal process. In addition, the driving current may be reduced by forming a junction through a SiGe self aligned epitaxial growth scheme.

However, even if the junction depth is adjusted through the above method, short channel effects (SCEs) such as gate induced drain leakage (GIDL) and drain induced barrier lowering (DIBL), reverse short channel effects, and a problem of the parasitic capacitance still remain.

In addition, although the semiconductor device may be highly integrated, a driving voltage is relatively high, so electrons supplied from a source are excessively accelerated due to the potential gradient of the drain, a hot carrier instability phenomenon occurs in the vicinity of the drain, and the adjustment of a threshold voltage is very difficult.

BRIEF SUMMARY

Embodiments of the present invention provide a semiconductor device and a method for manufacturing the same, capable of minimizing degradation of a sub-threshold characteristic and inhibiting a driving current from being reduced in a saturation state.

An embodiment provides a semiconductor device and a method for manufacturing the same, capable of minimizing degradation of a swing characteristic of a device and reducing parasitic capacitance in an overlap area between a gate and an LDD area in an inversion mode in which a sub-threshold current occurs.

An embodiment provides a semiconductor device and a method for manufacturing the same, capable of minimizing the occurrence of a short channel effect (SCE), reverse short channel effect (RSCE), and hot carrier instability (HCI) phenomenon, and easily adjusting a threshold voltage.

According to an embodiment, a semiconductor device includes an isolation area formed on a semiconductor substrate to define NMOS and PMOS areas, a gate insulating layer and a gate formed in each of the NMOS and PMOS areas, a primary gate spacer formed at sides of each gate, LDD areas formed at sides of each gate and under the primary gate spacer on the semiconductor substrate, a secondary gate spacer formed at sides of the primary gate spacer, source and drain areas formed at sides of the gate of the PMOS area and under the secondary gate spacer on the semiconductor substrate, and source and drain areas formed at sides of the gate of the NMOS area and under the secondary gate spacer on the semiconductor substrate, wherein the source and drain areas of the NMOS area are deeper than the source and drain areas of the PMOS area.

According to an embodiment, a method for manufacturing a semiconductor device includes forming an isolation area, defining an NMOS area and a PMOS area, on a semiconductor substrate, and forming a gate insulating layer and a gate on each of the NMOS and PMOS areas; forming a primary gate spacer layer on the semiconductor substrate including the gates, and forming LDD areas at sides of each gate; forming a primary gate spacer at sides of each gate by etching the primary gate spacer layer; forming a secondary gate spacer layer on the semiconductor substrate including the gates and the primary gate spacer; forming source and drain areas through the secondary gate spacer layer in the substrate at sides of the gate in the PMOS area; forming a second gate spacer at sides of each gate by etching the secondary gate spacer layer; and forming source and drain areas at sides of the gate in the NMOS area using the second gate spacer at the sides of the gate in the NMOS area as a mask.

DETAILED DESCRIPTION

Hereinafter, embodiments of a semiconductor device and a method for manufacturing the same will be described in detail with reference to accompanying drawings.

Detailed description about well known functions or configurations may make the subject matter of the disclosure unclear. Accordingly, hereinafter, description will be made regarding only essential components directly related to the technical spirit of the disclosure.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

FIGS. 4-7 show cross-sectional views for explaining a method of manufacturing a semiconductor device in accordance with certain embodiments of the present invention.

Figure 1:
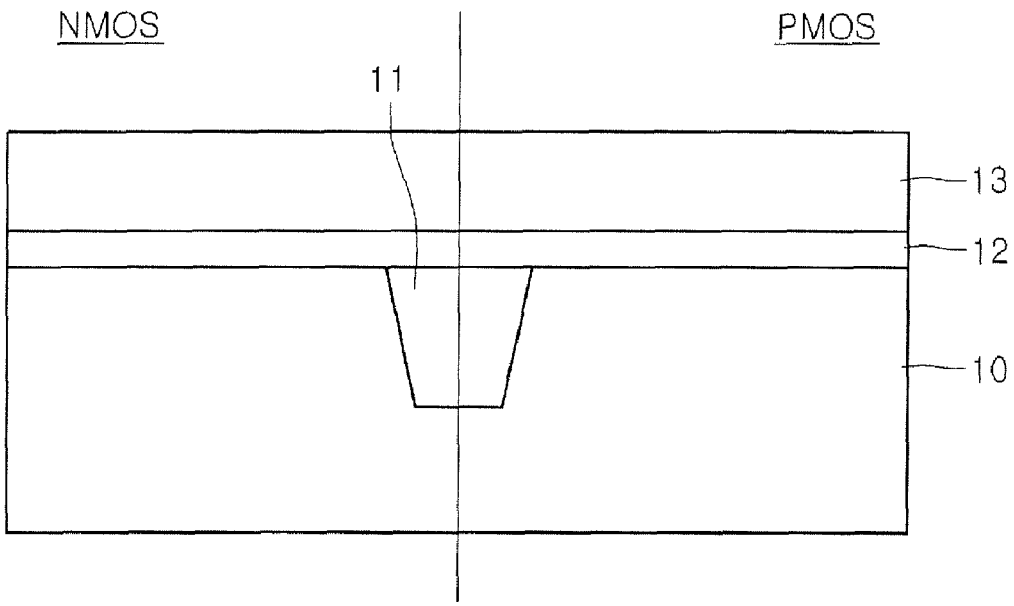
FIGS. 1 to 3 are views showing a method for manufacturing a symmetric semiconductor device.
Figure 2:
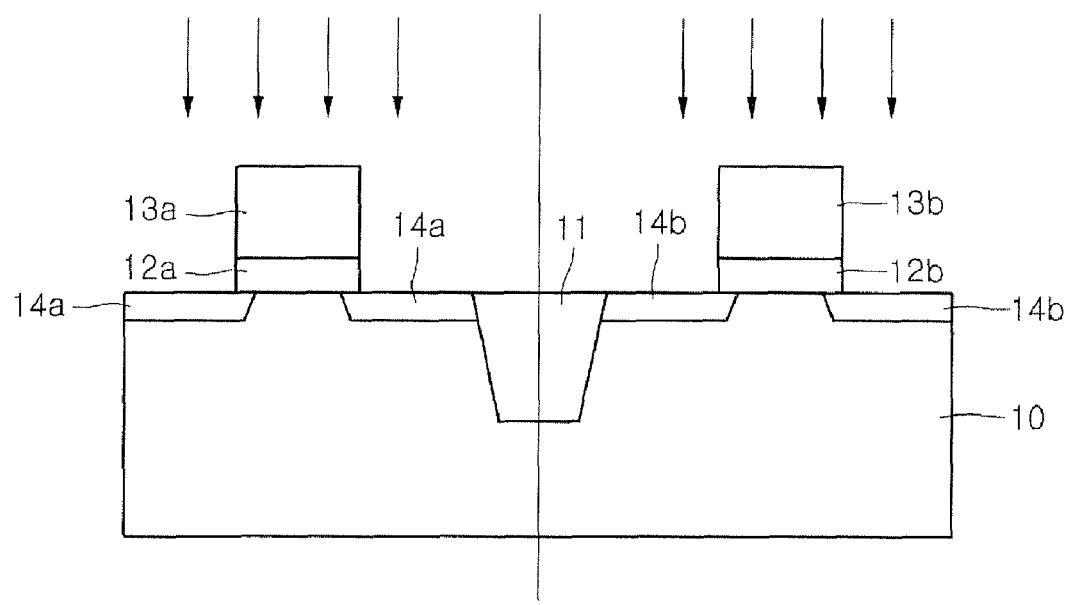
Figure 3:
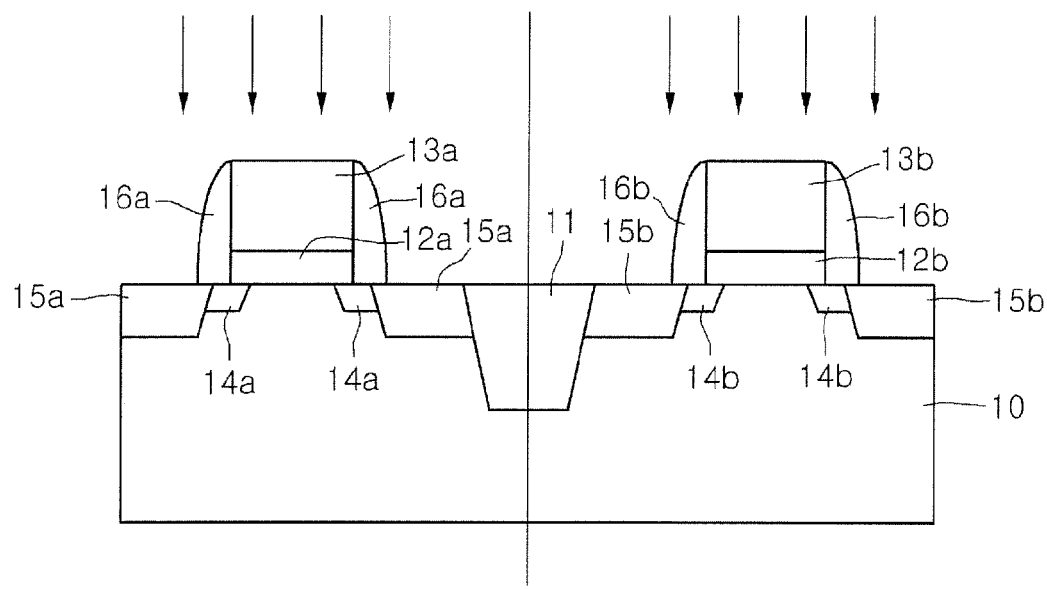
Figure 4:
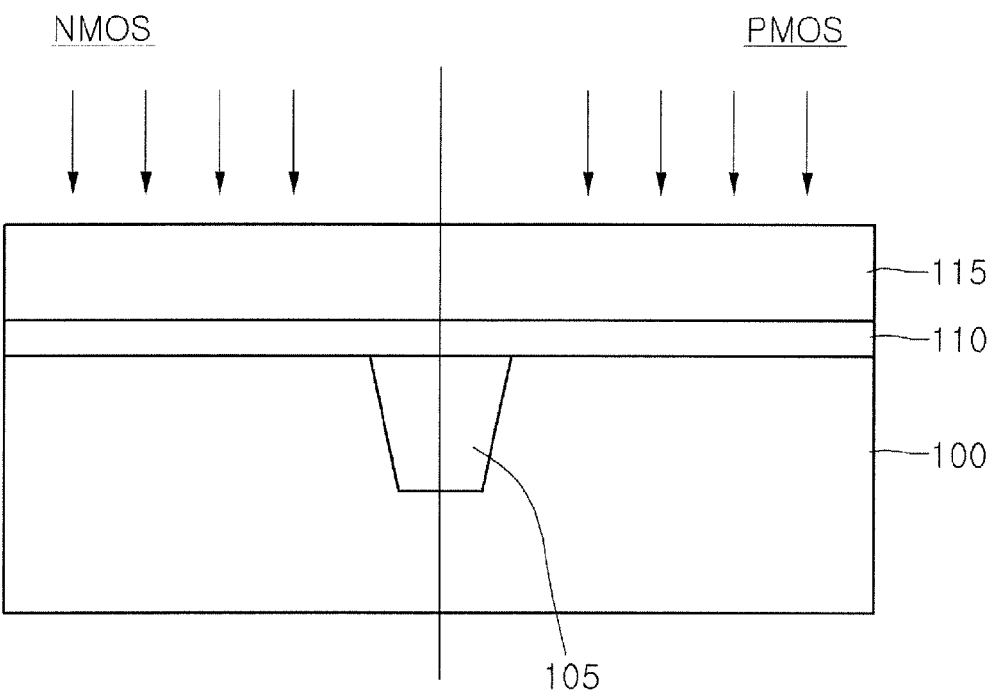
FIG. 4 is a cross-sectional view showing a semiconductor device after forming a polysilicon layer in accordance with an embodiment of the present invention.

Referring to FIG. 4, a substrate can be prepared, defining NMOS and PMOS areas. For example, after forming a trench in a semiconductor substrate 100 including silicon, an insulating layer is filled in the trench to form an isolation area 105.

Accordingly, with respect to the isolation area 105, a portion to one side of the semiconductor substrate 100 is an area for NMOS, and a portion to the other side of the semiconductor substrate 100 is an area for PMOS.

After forming well areas (not shown) in the NMOS and PMOS areas of the semiconductor substrate 100, an insulating layer 110 and a polysilicon layer 115 are sequentially formed on the semiconductor substrate 100.

According to an embodiment, the insulating layer 110a may include $SiO_2$ or NO. In addition, the polysilicon layer 115 may be doped with implanted impurities.

After forming a photoresist pattern to define a gate area through coating, exposure, and development processes for a photoresist layer, the insulating layer 110 and the polysilicon layer 115 are etched by using the photoresist pattern as an etch mask.

Figure 5:
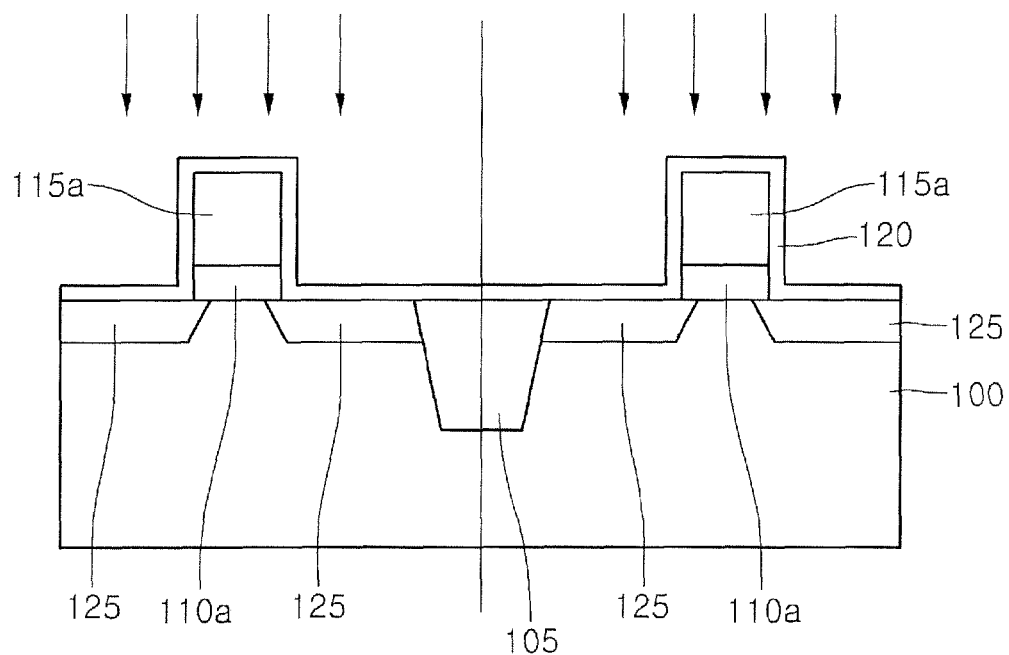
FIG. 5 is a cross-sectional view showing the semiconductor device after forming an LDD area in accordance with an embodiment of the present invention.

Accordingly, a gate insulating layer 110a and a gate 115 are formed as shown in FIG. 5.

Thereafter, a primary gate spacer layer 120 is formed on the entire semiconductor substrate 100 including the gate insulating layer 110a and the gate 115a.

The primary gate spacer layer 120 may be formed at a thickness of about 150 Å to about 200 Å by using SiN through a low pressure-chemical vapor deposition (LP-CVD) scheme.

After the primary gate spacer layer 120 has been formed, the resultant structure is subject to an ion implantation process to form an LDD area 125 and a pocket area. Although not shown in the figure, the pocket area may be formed at an end of the LDD 125 below the gate 115a.

According to the embodiment, the LDD area 125 and the pocket area are simultaneously formed through one ion implantation process.

For example, in the case of the NMOS area, ions such as As or Sb are implanted to form the LDD area 125, and ions such as $BF_2$ or In may be implanted to form the pocket area.

In the case of the PMOS area, ions such as B or In are implanted to form the LDD area 125, and ions such as As or Sb may be implanted to form the pocket area.

In this case, the LDD area 125 can be formed in a shallow type, and a short channel effect (SCE) can be minimized by using the primary gate spacer layer 120.

In other words, since the depth of the LDD area 125 can be controlled through the primary gate spacer layer 120, an effective channel depth can be optimized, and the operating speed of a device can be stably maintained.

In addition, since the primary gate spacer layer 120 positioned at a side wall of the gate 115a inhibits the LDD area 125 from overlapping the gate 115a, the operating speed can be inhibited from being reduced due to parasitic capacitance.

Figure 6:
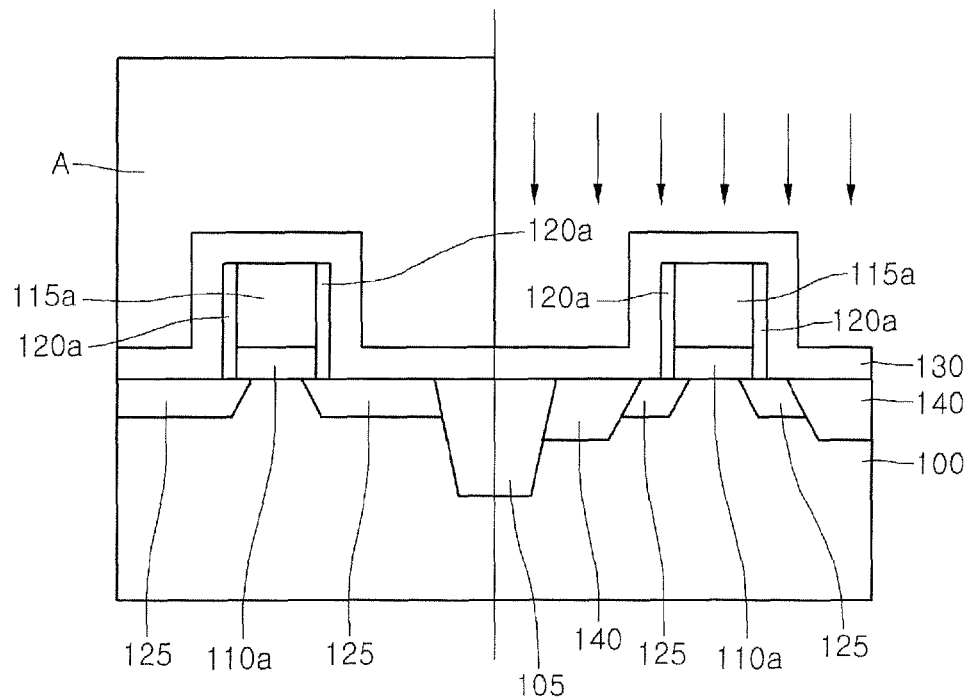
FIG. 6 is a cross-sectional view showing the semiconductor device after forming a source/drain in a PMOS area in accordance with embodiment of the present invention.

Referring to FIG. 6, after the LDD area 125 has been formed, the primary gate spacer layer 120 is etched to form primary gate spacers 120a.

The primary gate spacer 120a may be formed through a blanket etching process. At this time, the primary gate spacers 120a are self-aligned so that the primary gate spacers 120a remain only at sides of the gates 115a.

Thereafter, a second gate spacer layer 130 is formed on the entire semiconductor substrate 100 including the gates 115a and the primary gate spacers 120a.

The secondary gate spacer layer 130 may be formed at a thickness of about 400 Å to about 600 Å by using SiN through an LP-CVD scheme.

The secondary gate spacer layer 130 may have a thickness of two to four times the thickness of the primary gate spacer layer 120.

After the secondary gate spacer layer 130 has been formed, a photoresist pattern A is formed through a photolithography process to cover only the NMOS area, and ions such as boron (B) or In are implanted into the resultant structure to form the source/drain area 140 in the PMOS area.

In this case, the secondary gate spacer layer 130 blocks a portion of ions such that the source/drain area 140 has a shallow type in the PMOS area.

Accordingly, a transient boron enhanced diffusion (TED) phenomenon caused by the use of B, an SCE caused by the TED phenomenon, and a leakage current of a gate/junction can be overcome or reduced.

Figure 7:
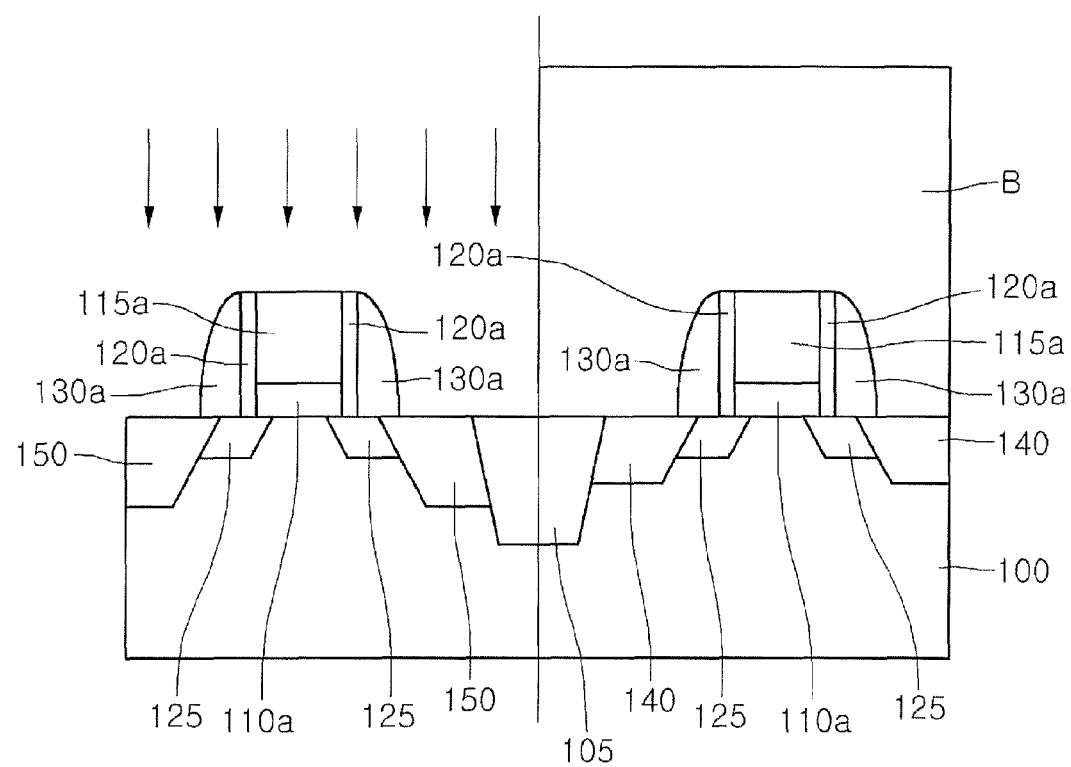
FIG. 7 is a cross-sectional view showing the semiconductor device after forming a source/drain in an NMOS area in accordance with an embodiment of the present invention.

Referring to FIG. 7, after the source/drain area 140 has been formed in the PMOS area, the photoresist pattern A is removed from the NMOS area and the secondary gate spacer layer 130 is etched to form secondary gate spacers 130a.

Similarly to the primary gate spacers 120a, the secondary gate spacers 130a may be formed through a blanket etching process. In this case, the secondary gate spacers 130a are self-aligned such that the secondary gate spacers 130a remain only at sides of the gates 115a.

After the secondary gate spacers 130a have been formed, a photoresist pattern B is formed through a photolithography process to cover only the PMOS area, and ions such as arsenic (As) or Sb are implanted into the resultant structure to form the source/drain area 150 in the NMOS area.

In contrast to the source/drain area 140 formed in the PMOS area, since the secondary gate spacer layer 130 has already been changed into the secondary gate spacers 130a, the source/drain area 150 of the NMOS area may be formed more deeply than the source/drain area 140 of the PMOS area.

Thereafter, the photoresist pattern B is removed from the PMOS area, and an active junction area is activated through a heat treatment process such as a laser spike anneal (LSA) process.

The effects of the described embodiments can be as follows.

First, the LDD area and the source/drain area are formed by using a gate spacer having a dual structure, thereby minimizing influences of parasitic capacitance caused by gate overlap and an ultra shallow junction.

Second, since the LDD area and the pocket area are formed through the primary gate spacer to effectively control the effective channel length, the operating speed of the semiconductor device can be increased, and the operating reliability of the semiconductor device can be ensured.

Third, a shallow junction structure can be selectively realized in the PMOS area through the secondary gate spacer. Accordingly, problems related to a leakage current in the active area and an SCE caused by the TED phenomenon can be solved.

Fourth, according to an embodiment, the manufacturing process can be more simplified, and the manufacturing cost can be reduced as compared with an implantation process using heavy ions and a SiGe self aligned epitaxial growth process for a strained Si structure.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a semiconductor device, the method comprising:
   forming an isolation area, defining an NMOS area and a PMOS area, on a semiconductor substrate, and forming a gate insulating layer and a gate on each of the NMOS and PMOS areas;
   forming a primary gate spacer layer on the semiconductor substrate including the gates, and forming LDD areas at sides of the gates;
   forming a primary gate spacer at both sides of the gate by etching the primary gate spacer layer after forming the LDD areas;
   forming a secondary gate spacer layer on the semiconductor substrate including on the gates and the primary gate spacer, and forming source and drain areas at sides of the gate in the PMOS area;
   forming a second gate spacer at sides of the gates by etching the secondary gate spacer layer after forming the source and drain areas in the PMOS area; and
   forming source and drain areas at sides of the gate in the NMOS area using the second gate spacer as a mask.

2. The method of claim 1, wherein one of the primary and secondary gate spacers comprises SiN.

3. The method of claim 1, wherein the forming of the LDD area includes forming a pocket area.

4. The method of claim 3, wherein the pocket area of the NMOS area is formed by implanting at least one of $BF_2$ and In, and the pocket area of the PMOS area is formed by implanting at least one of As and Sb.

5. The method of claim 3, wherein the LDD area and the pocket area are simultaneously formed through one ion implantation process.

6. The method of claim 1, wherein the LDD area of the NMOS area is formed by implanting ions including at least one of As and Sb, and the LDD area of the PMOS area is formed by implanting ions including at least one of B and In.

7. The method of claim 1, wherein at least one of the primary and secondary gate spacers is self-aligned through a blanket etching process.

8. The method of claim 1, wherein the secondary gate spacer layer has a thickness of two to four times a thickness of the primary gate spacer.

9. The method of claim 1, wherein the forming of the source and drain areas in the PMOS area comprises:
   forming the secondary gate spacer layer on the semiconductor substrate;
   forming a photoresist pattern on the semiconductor device such that the NMOS area is covered;
   forming the source and drain areas in the PMOS area by performing an ion implantation process through the secondary gate spacer layer using the photoresist pattern as a mask; and
   removing the photoresist pattern.

10. The method of claim 1, wherein the source and drain areas of the PMOS area are formed by implanting ions including at least one of B and In.

11. The method of claim 1, wherein the forming of the source and drain areas in the NMOS area includes:
   forming the secondary gate spacer at the sides of the gates;
   forming a photoresist pattern on the semiconductor device such that the PMOS area is covered;
   forming the source and drain areas in the NMOS area by performing an ion implantation process using the secondary gate spacer and the photoresist pattern as a mask; and
   removing the photoresist pattern.

12. The method of claim 1, wherein the source and drain areas of the NMOS area is formed by implanting ions including at least one of As and Sb.

13. The method of claim 1, wherein the source and drain areas of the NMOS area are formed more deeply than the source and drain areas of the PMOS area.

14. The method of claim 1, further comprising activating an active junction area through a spike anneal process, after forming the source and drain areas in the NMOS area.

15. A semiconductor device comprising:
- an isolation area on a semiconductor substrate, defining NMOS and PMOS areas;
- a gate insulating layer and a gate on each of the NMOS and PMOS areas;
- a primary gate spacer at sides of the gates;
- LDD areas at sides of the gates, including under the primary gate spacer;
- a secondary gate spacer at sides of the primary gate spacer, wherein the secondary gate spacer is disposed on a sidewall of the primary gate spacer and the semiconductor substrate adjacent the primary gate spacer;
- source and drain areas at sides of the gate of the PMOS area, including under the secondary gate spacer; and
- source and drain areas at sides of the gate of the NMOS area, including under the secondary gate spacer,
- wherein the source and drain areas of the NMOS area are deeper than the source and drain areas of the PMOS area.

16. The semiconductor device of claim 15, wherein at least one of the primary and second gate spacer layers comprises SiN.

17. The semiconductor device of claim 15, further comprising a pocket area including at least a portion of the LDD area.

18. The semiconductor device of claim 15, wherein the secondary gate spacer has a thickness of two to four times a thickness of the primary gate spacer.

* * * * *